(12) United States Patent
Kanekiyo

(10) Patent No.: US 12,007,444 B2
(45) Date of Patent: Jun. 11, 2024

(54) SPARK DISCHARGE DETECTION DEVICE HAVING WAVEFORM EXTENSION CIRCUIT AND SPARK DISCHARGE DETECTION METHOD

(71) Applicant: KABUSHIKI KAISHA TOSHIBA, Tokyo (JP)

(72) Inventor: Yasuhiro Kanekiyo, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/931,171

(22) Filed: Sep. 12, 2022

(65) Prior Publication Data
US 2023/0296675 A1    Sep. 21, 2023

(30) Foreign Application Priority Data
Mar. 18, 2022 (JP) ................. 2022-044122

(51) Int. Cl.
*G01R 31/34* (2020.01)
*G01R 19/165* (2006.01)

(52) U.S. Cl.
CPC ......... *G01R 31/343* (2013.01); *G01R 19/165* (2013.01)

(58) Field of Classification Search
CPC ........ G01R 31/12; G01R 31/52; G01R 31/14; G01R 31/00; G01R 31/085; G01R 19/2513; G01R 31/3277; G01R 31/54; G01R 31/005; G01R 23/02; G01R 31/346; G01R 35/00; G01R 31/34; G01R 31/343; G01R 19/165; G01R 29/26; G01R 31/56; G01R 31/3275; G01R 15/183; G01R 35/005; G01R 33/36; G01R 31/72; G01R 13/42; G01M 15/11; G01M 15/042; G01M 15/044; G01M 15/05; G01M 15/04; G01M 3/40; G01M 99/005; G01M 13/00; G06F 11/26;
(Continued)

(56) References Cited

U.S. PATENT DOCUMENTS 4,563,675 A * 1/1986 Miller .................. G01R 31/343
340/682
4,577,151 A * 3/1986 Tanisaka .............. G01R 31/343
324/102
(Continued)

FOREIGN PATENT DOCUMENTS

JP    2019-54575 A    4/2019
JP    2023-38008 A    3/2023

*Primary Examiner* — Vinh P Nguyen
(74) *Attorney, Agent, or Firm* — Finnegan, Henderson, Farabow, Garrett & Dunner, LLP

(57) ABSTRACT

A spark discharge detection device includes a discharge detector, a waveform extension circuit, and determination circuit. The discharge detector includes a metal electrode that detects discharge between an electrode and a sliding body that is in contact with and sliding surface of the electrode. The waveform extension circuit configured to extend a discharge waveform output from the discharge detector in a time direction. The determination circuit configured to determine that discharge has occurred in the sliding body when a signal value exceeds a first threshold and a time during which the signal value exceeds the first threshold is held for a time longer than a first time for the output of the waveform extension circuit.

13 Claims, 5 Drawing Sheets

(58) Field of Classification Search
CPC ...... G01N 21/67; G01N 27/205; G01N 27/70; G01N 27/24; G01N 27/92; H02P 29/0241; H02P 3/06; H02P 6/18; H02P 6/20; H02P 9/48; H02P 7/2913; H02P 1/16; H02P 21/22; H02N 11/006; H02N 1/00; H02N 1/002
See application file for complete search history.

(56) References Cited

U.S. PATENT DOCUMENTS

| | | | | |
|---|---|---|---|---|
| 4,863,612 | A * | 9/1989 | Kirman | C22B 3/42 |
| | | | | 423/139 |
| 8,396,677 | B2 * | 3/2013 | Hobelsberger | G01R 31/343 |
| | | | | 702/58 |
| 8,981,699 | B2 * | 3/2015 | Obata | B60L 3/0069 |
| | | | | 324/544 |
| 9,037,438 | B2 * | 5/2015 | Cavallini | G01R 31/12 |
| | | | | 702/58 |
| 9,046,579 | B2 * | 6/2015 | Gattermann | G01M 13/04 |
| 2019/0079118 | A1 | 3/2019 | Yanagita | |
| 2023/0076743 | A1 | 3/2023 | Inoue et al. | |

* cited by examiner

SPARK DISCHARGE DETECTION DEVICE HAVING WAVEFORM EXTENSION CIRCUIT AND SPARK DISCHARGE DETECTION METHOD

CROSS REFERENCE TO THE RELATED APPLICATIONS

This application is based upon and claims the benefit of priority from the prior Japanese Patent Application No. 2022-044122, filed on Mar. 18, 2022, the entire contents of which are incorporated herein by reference.

FIELD

Embodiments described herein relate generally to a spark discharge detection device and a spark discharge detection method.

BACKGROUND

A sliding energization mechanism that brings two different electrical components into contact with each other and conducts electricity between the electrical components is used in various electrical products in various fields as an energization method of an electrical machine having a movable portion, as represented by a brush, a collector ring (slip ring), or the like of a rotating electrical machine. In such a sliding energization mechanism, since the electric components are gradually worn by sliding, maintenance work such as inspection and replacement is required.

However, the wear state of the electric component greatly varies depending on operating conditions of the electric machine, a surrounding environment, and a state of a contact cross section of a slide-contact portion, and when a magnitude of a current flowing through each component varies, a speed of wear also varies. When the sliding energization mechanism stops functioning, the current flow is interrupted, which may cause a serious accident due to the stoppage of the electric machine. In addition, at a timing when the sliding energization mechanism stops functioning and the current flow starts to be interrupted, it has been found that spark discharge occurs at a portion where the two different electric components are in contact with each other, and abnormality can be detected by monitoring a state of an electric sliding component and detecting the spark discharge.

It is desirable that a detection device automatically detects the spark discharge generated in a very short time at an early stage with high accuracy. For this reason, the detection device is desired to correctly detect an impulse wave due to the spark discharge at a high speed, but an electronic component capable of high-speed sampling is required in order to configure the detection device that operates at a high speed, and the cost of the device increases. Furthermore, a large-capacity storage device that stores a sampling result executed at a high speed is required in order to detect spark discharge of which occurrence cannot be predicted, and the cost also increases in securing the storage capacity.

DETAILED DESCRIPTION

According to an embodiment, a spark discharge detection device includes a discharge detection unit, a waveform extension circuit, and determination circuit. The spark discharge detection unit includes a metal electrode that detects spark between an electrode and a sliding body that is in contact with and is slidable on the electrode. The waveform extension circuit configured to extend a discharge waveform output from the discharge detection unit in a time direction. The determination circuit configured to determine that discharge has occurred in the sliding body when a signal value exceeds a first threshold and a time during which the signal value exceeds the first threshold is held for a time longer than a first time for the output of the waveform extension circuit.

Hereinafter, embodiments will be described with reference to the drawings. In the present disclosure, the terms "greater than or equal to" and "less than or equal to" may be used, but these terms may be read as long as they do not contradict with "larger (higher)", "smaller (lower)", and the like. The reverse may be read in the same manner.

Figure 1:
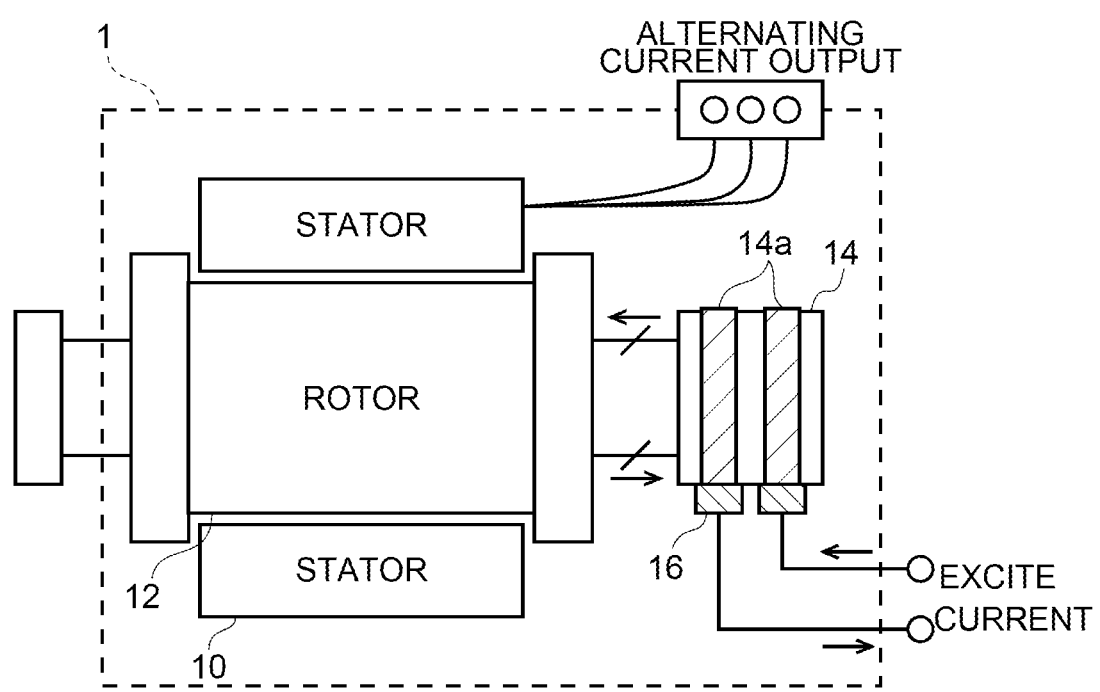
FIG. 1 is a diagram schematically illustrating a generator using a rotating electrical machine according to an embodiment.

FIG. 1 is a diagram schematically illustrating a generator using a rotating electrical machine according to the embodiment. FIG. 1 is illustrated as a non-limiting example, and spark discharge detection in the present disclosure is not limited to the rotating electrical machine having this configuration, and can be used for a device that includes a sliding mechanism and may generate discharge or spark discharge.

A generator 1 includes a stator 10, a rotor 12, a rotating portion 14, and a stationary portion 16.

The stator 10 is fixed and installed in the generator 1. The rotor 12 is rotatable between the stators 10 or in the stator 10. When the rotor 12 is excited, the rotor 12 rotates about an axis inside the stator 10. When the rotor 12 rotates in the rotating portion 14, a current is generated in the stator 10, and an appropriate alternating current is output. In addition, in a case where a permanent magnet is used for the stator 10, the rotor 12 rotates in the rotating portion 14, whereby a current is generated in the rotor 12, and output is performed via the rotating portion 14.

The rotating portion 14 rotates together with the rotor 12. The rotating portion 14 is, for example, a slip ring.

The stationary portion 16 is an electrode installed in contact with an electrode portion 14a of the rotating portion 14. The electrodes come into sliding contact with each other between the rotating portion 14 and the stationary portion 16. The stationary portion 16 is, for example, a brush-type electrode, and when an excitation current flows through the electrode portion 14a via the stationary portion 16, the rotor 12 is excited to form a magnetic flux (electromagnet).

Spark discharge may occur in a sliding energization portion between the rotating portion 14 and the stationary portion 16. The discharge detection device according to the present disclosure appropriately detects the discharge.

Figure 2:
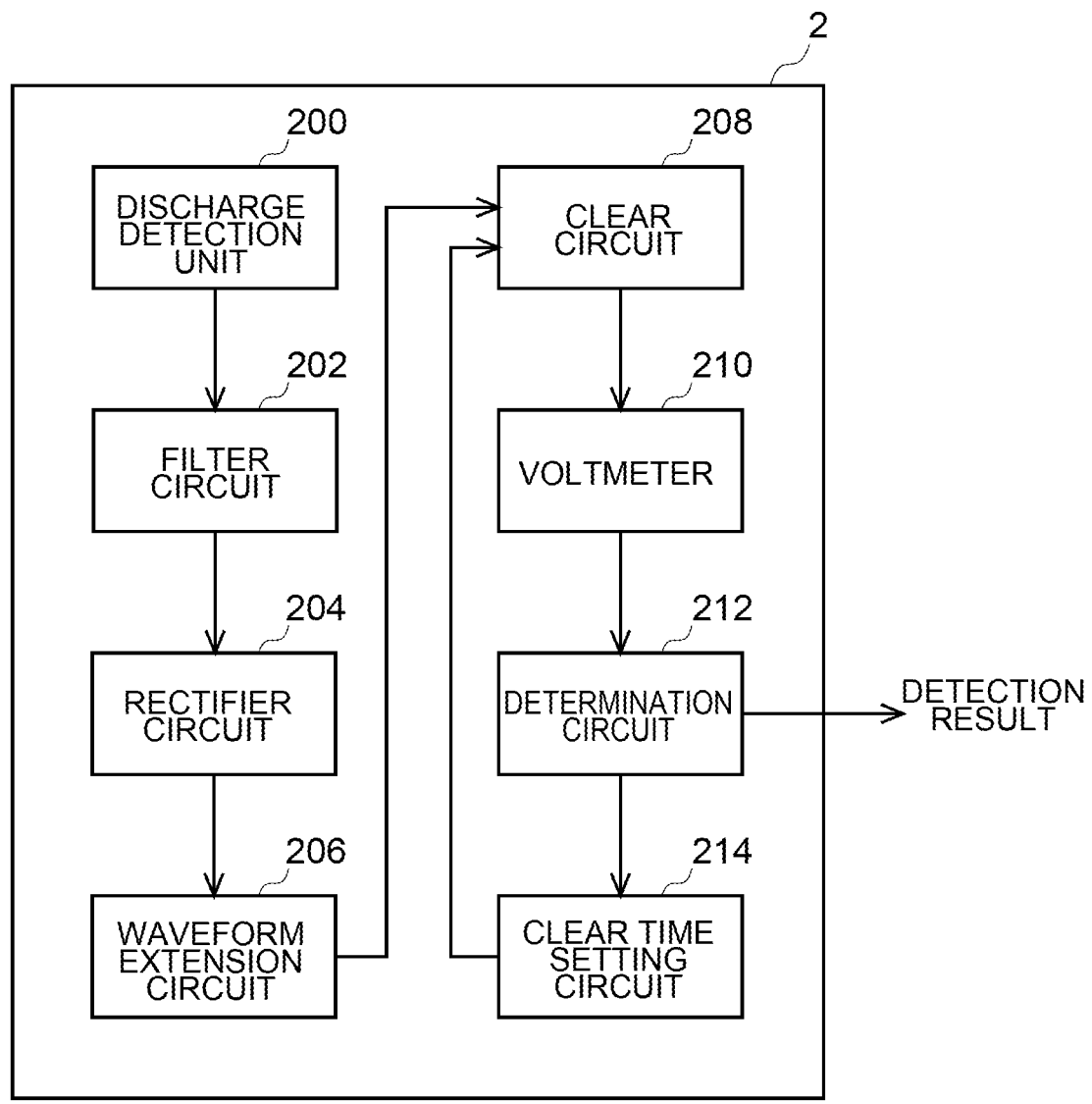
FIG. 2 is a block diagram schematically illustrating a spark discharge detection device according to an embodiment.

FIG. 2 is a block diagram schematically illustrating the discharge detection device according to the embodiment. A discharge detection device 2 includes a discharge detection unit 200, a filter circuit 202, a rectifier circuit 204, a waveform extension circuit 206, a clear circuit 208, a voltmeter 210, a determination circuit 212, and a clear time setting circuit 214. The discharge detection device 2 detects discharge at a slide-contact portion. The discharge detection device 2 detects, for example, spark discharge at the slide-contact portion.

Among these, the filter circuit 202, the rectifier circuit 204, the clear circuit 208, and the clear time setting circuit 214 can be arbitrarily provided. That is, the discharge detection device 2 only needs to include the discharge detection unit 200, the waveform extension circuit 206, the voltmeter 210, and the determination circuit 212 as a minimum configuration.

First Embodiment

As a first embodiment, the discharge detection device 2 including the discharge detection unit 200, the waveform extension circuit 206, the voltmeter 210, and the determination circuit 212, which are the minimum configuration among the above, will be described. In this case, the filter circuit 202, the rectifier circuit 204, the clear circuit 208, and the clear time setting circuit 214 in FIG. 2 are omitted. That is, the waveform extension circuit 206 is coupled to an output of the discharge detection unit 200, the voltmeter 210 is coupled to an output of the waveform extension circuit 206, and the determination circuit 212 is coupled to an output of the voltmeter 210. Although a detailed description of the coupling may be omitted in the following embodiments, appropriate components are coupled to each other based on FIG. 2 and the like.

The discharge detection unit 200 includes a metal electrode that detects the discharge of the slide-contact portion between the electrode portion 14a of the rotating portion 14 in FIG. 1 and the stationary portion 16 (sliding portion) in slide contact with (that is, capable of being in contact with and sliding surface of the electrode portion 14a) the electrode portion 14a. The discharge detection unit 200 is disposed, for example, at a distance at which discharge from the slide-contact portion can be captured. In a case of detecting spark discharge, the discharge detection unit 200 is disposed, for example, at a position where a spark generated at the slide-contact portion is scattered on the metal electrode. In addition, when the discharge detection unit 200 having a physically large shape is used, the discharge detection unit 200 is disposed at a distance at which discharge can be captured at a place (outside the generator 1) away from a casing of the generator 1 having the slide-contact portion between the electrode portion 14a of the rotating portion 14 in FIG. 1 and the stationary portion 16 in slide contact with the electrode portion 14a.

The waveform extension circuit 206 is a circuit that extends a discharge waveform output from the discharge detection unit 200 in a time direction. The waveform extension circuit 206 may include a so-called integration circuit. With the integration circuit, only the waveform can be extended in the time direction without destroying frequency characteristics.

Figure 3:
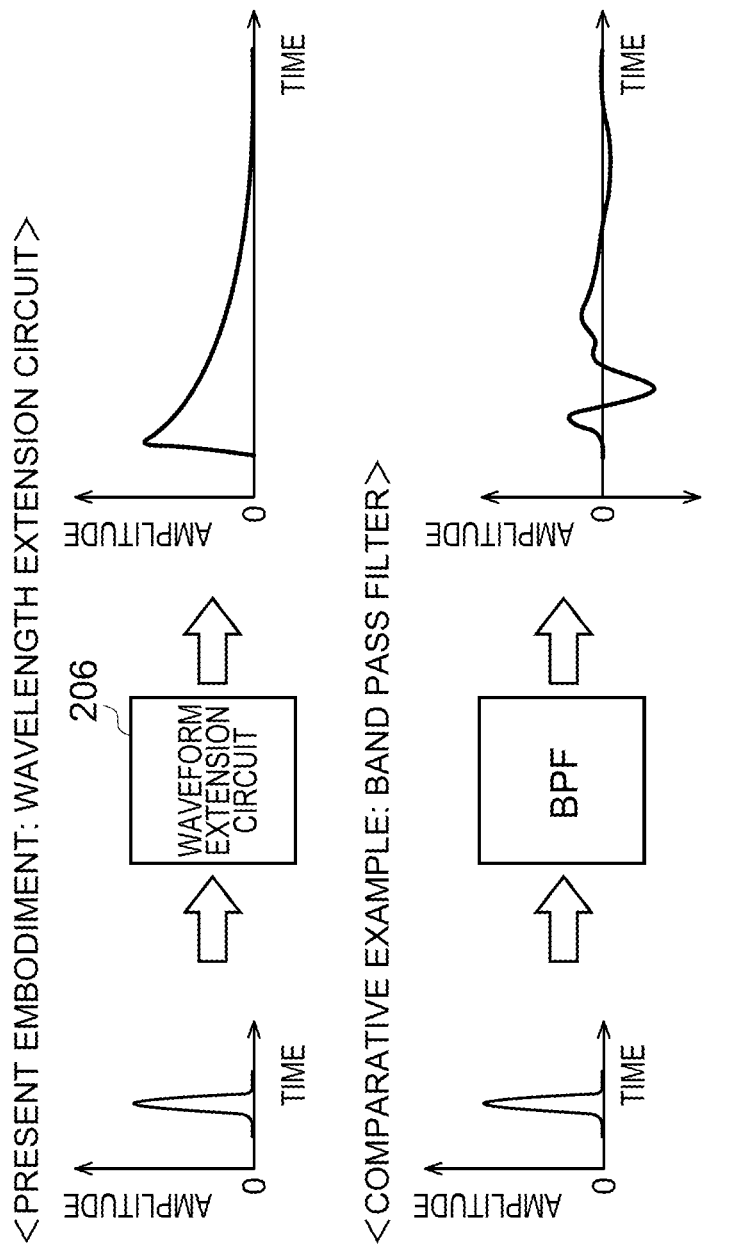
FIG. 3 is a diagram schematically illustrating an example of waveform extension according to an embodiment.

FIG. 3 is a diagram illustrating an example of input and output waveforms of the waveform extension circuit 206. When an impulse-shaped waveform signal is input, the waveform extension circuit 206 outputs a waveform signal obtained by extending the waveform in the time direction. Such extension of the waveform can be achieved by the integration circuit in which a predetermined time constant is set.

The lower diagram is a comparative example using a band pass filter (or a low pass filter), and shows that when the impulse-shaped waveform signal is input, a frequency component of a certain band is output by the band pass filter. According to the band pass filter, as illustrated in this drawing, for example, components other than a predetermined frequency component are removed, so that the waveform cannot be maintained. In addition, by removing the components other than the predetermined frequency component, a negative value is generated in the waveform as illustrated in the drawing.

As illustrated in this drawing, unlike the band pass filter, by extending the waveform of the signal without removing a high-frequency component by using the waveform extension circuit 206, the waveform can be extended in the time direction while appropriately maintaining an amplitude and a waveform. The waveform extension circuit 206 may include a voltage holding time constant circuit that accumulates a voltage for a predetermined time. Based on this time constant, the waveform extension circuit 206 accumulates the voltage, appropriately extends the waveform in the time direction, and outputs the waveform.

Returning to FIG. 2, the voltmeter 210 is coupled to the output of the waveform extension circuit 206, and measures and outputs the voltage of the waveform output from the waveform extension circuit 206. The measurement result is output to the determination circuit 212. The voltmeter 210 may have a sampling type voltmeter that detects and holds the discharge waveform for a sampling time that is ½ or less of the voltage holding time constant of the waveform extension circuit 206.

The determination circuit 212 is a circuit that determines whether discharge has occurred based on the waveform output from the waveform extension circuit 206. The determination circuit 212 uses, for example, an output waveform of the waveform extension circuit 206 output as voltage information by the voltmeter 210 for determination. The determination circuit 212 measures a time during which an absolute value of the voltage of the signal exceeds a first threshold. When the time during which the voltage exceeds the first threshold is longer than a first time, the determination circuit 212 determines that discharge has occurred at the slide-contact portion.

As described above, according to the present embodiment, when discharge (for example, spark discharge) occurs at the slide-contact portion, the signal output from the detection unit in the vicinity of the slide-contact portion is extended in the time direction, and a magnitude of an amplitude of the extended signal and a length of time having a large amplitude are determined, so that the discharge can be appropriately detected regardless of other factors such as noise. In addition, the circuit described above can be mounted without using a costly element having a high sampling speed. Therefore, the cost of the discharge detection device 2 can be reduced without lowering an accuracy of the discharge detection.

In an installation environment of an electric machine provided with the electric sliding component, noise due to operation of another electric machine or a large power device occurs. The generated noise may propagate to the discharge detection unit 200 by radiation or conduction, and in this case, the generated noise affects a waveform captured by the discharge detection unit 200. The discharge from the slide-contact portion and the influence of the noise are greatly different in a signal value. Therefore, even in such a case, the discharge detection device 2 can appropriately detect the discharge from the slide-contact portion by having at least the above configuration.

Second Embodiment

The discharge detection device 2 may include the rectifier circuit 204 in addition to the minimum configuration of the first embodiment.

The rectifier circuit 204 includes an insulating portion that is physically insulated between the discharge detection unit 200 and the waveform extension circuit 206. That is, the rectifier circuit 204 is a rectifier that outputs a signal output from the discharge detection unit 200 to the waveform extension circuit 206 in a state where a coupling end is physically insulated from an internal electric circuit of the waveform extension circuit 206 on an input side of the waveform extension circuit 206.

For example, the rectifier circuit 204 receives a signal by differential input, extracts an absolute value of the amplitude of the differentially input signal, and outputs the absolute value to the waveform extension circuit 206. An example of a specific circuit configuration will be described later.

As described above, according to the present embodiment, the waveform input to the waveform extension circuit can be converted into a positive component and input. By using the waveform of the positive component, even when the signal output from the discharge detection unit 200 is a waveform changing in both positive and negative directions, it is possible to extend the waveform changing only in one direction by the waveform extension circuit 206, and it is possible to convert an impulse-shaped discharge detection signal into a low-frequency electric signal by holding a voltage at a time constant predetermined in advance.

Third Embodiment

The discharge detection device 2 may include the filter circuit 202 in addition to the configuration of each of the above-described embodiments.

The filter circuit 202 may be a circuit that selectively transmits a signal portion having a component larger than a second threshold with respect to the signal output from the discharge detection unit 200. The waveform extension circuit 206 extends the signal having the component larger than the second threshold in the time direction.

By including such a filter circuit 202, it is possible to detect the discharge from the slide-contact portion in a state where a noise component having a small amplitude is more accurately eliminated in each of the above-described embodiments. Note that the second threshold may be the same value as the first threshold, or may be a value smaller or larger than the first threshold.

In addition, the filter circuit 202 may include an amplitude limiting circuit that removes a waveform having an amplitude greater than or equal to a predetermined amplitude from a viewpoint of avoiding destruction of the element included in the circuits of the waveform extension circuit 206 and the voltmeter 210. For example, the filter circuit 202 may output the amplitude greater than or equal to the predetermined amplitude while saturating the amplitude to the predetermined amplitude. The filter circuit 202 that achieves the amplitude limitation may not be coupled to the output of the discharge detection unit 200 as illustrated in FIG. 2, but may be disposed in a preceding stage of the waveform extension circuit 206 or a preceding stage of the voltmeter 210 as another example.

By providing such a filter circuit 202, it is possible to achieve detection of discharge by using an element having a non-high withstand voltage. As a result, the cost of the discharge detection device 2 can be further reduced.

As another example, the filter circuit 202 may include a band-pass filter circuit that selectively transmits an electric signal in a predetermined frequency band to remove a noise component.

The circuits mentioned above as some examples may be configured in appropriate combination. As an example, the filter circuit 202 may be configured as a circuit that performs processing of making the amplitude higher than the second threshold and saturating the amplitude to a predetermined amplitude that is an amplitude higher than the second threshold.

Fourth Embodiment

The discharge detection device 2 may include the clear circuit 208 in addition to the configuration of each of the above-described embodiments.

The clear circuit 208 is coupled between the waveform extension circuit 206 and the voltmeter 210. The clear circuit 208 is a circuit that clears a voltage signal held in the waveform extension circuit 206 to an initial value, for example, a ground voltage, after a second time elapses from when a voltage signal detected by the voltmeter exceeds the first threshold.

Figure 4:
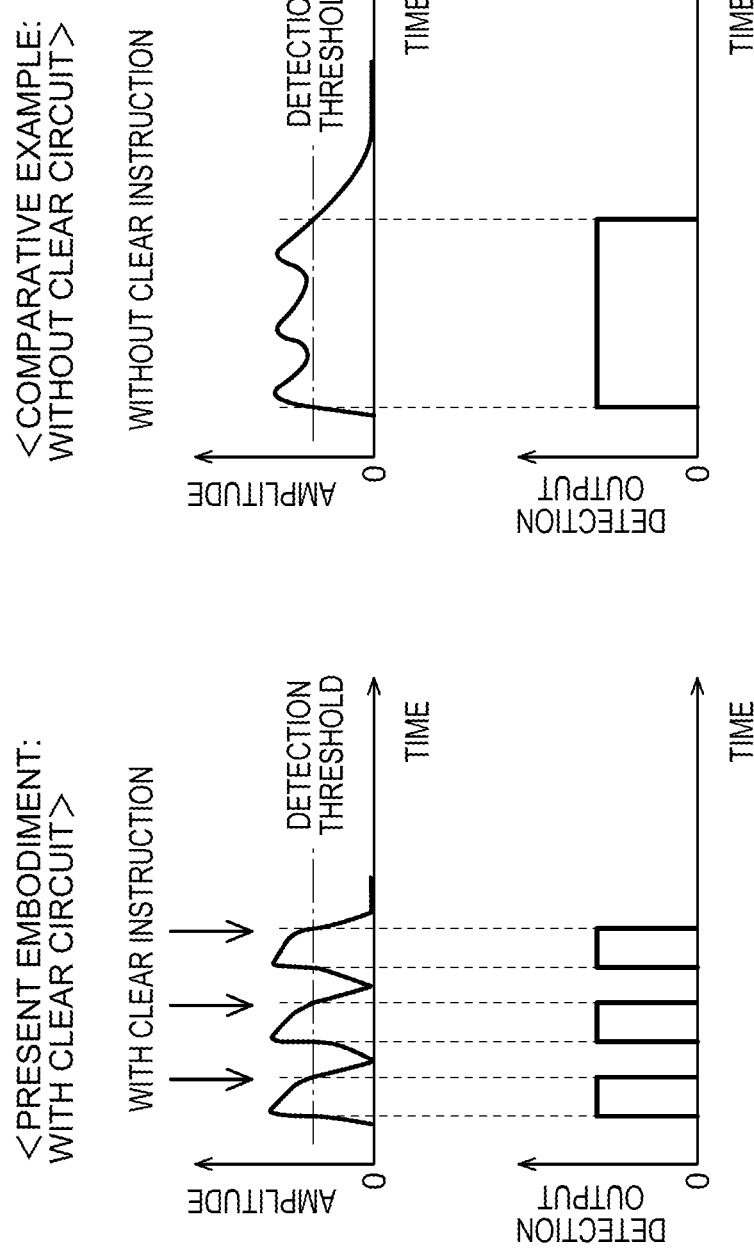
FIG. 4 is a diagram schematically illustrating an example of a clear state of an extension wavelength by a clear circuit according to an embodiment.

FIG. 4 is a diagram illustrating an example of detection based on a threshold from the extended waveform in a case where the clear circuit 208 is provided and a case where the clear circuit 208 according to the above-described embodiments is not provided. By including the clear circuit 208 according to the present embodiment, the determination circuit 212 can appropriately detect that a plurality of discharges have occurred even when voltage values exceeding the first threshold are continuously generated.

The clear circuit 208 may clear the output of the waveform extension circuit 206 at a time interval longer than the first time. As another example, the discharge detection device 2 may further include the clear time setting circuit 214. The clear circuit 208 executes signal processing so as not to overlap with a next waveform, for example, by discharging a capacitor that determines a time constant provided in the waveform extension circuit 206.

The clear time setting circuit 214 sets a clear time from a sampling time of the voltmeter 210 and transmits the clear time to the clear circuit 208. In a case where the sampling time of the voltmeter 210 is fixed, the clear time setting circuit 214 is not an essential configuration. On the other hand, the sampling time of the voltmeter 210 may be variable, or the sampling time of the voltmeter 210 may fluctuate.

Even in such a case, the clear time setting circuit 214 acquires the sampling time of the voltmeter 210, so that it is possible to appropriately clear the extension wavelength. The clear time setting circuit 214 sets, for example, a second time longer than the first time and shorter than the sampling time of the voltmeter 210, and outputs a timing signal for clearing the extension wavelength to the clear circuit 208 at a timing when the second time elapses after the first predetermined value is exceeded.

The clear time setting circuit 214 may measure the sampling time of the voltmeter 210, and transmit the timing of clearing to the clear circuit 208 based on the timing of receiving a determination signal for detecting the discharge from the determination circuit 212. Based on the second time acquired from the clear time setting circuit 214, the clear circuit 208 sets the voltage value to the ground voltage at the timing of the second time after the voltage value exceeds the first threshold in the signal output from the waveform extension circuit 206.

As illustrated in a right diagram of FIG. 4, in a case where discharges are continuously generated, a waveform due to new discharge may be superimposed (or overlapped) on a signal that is being attenuated in the extended waveform. In such a case, as illustrated in a lower right diagram, when signal waveforms are compared and output at a predetermined threshold (first threshold), the waveform is extracted as a continuous large waveform instead of respective waveforms.

As in the present embodiment, by giving a clear instruction of the extended waveform by the clear circuit 208, it is possible to appropriately divide and extract the continuously generated discharges one by one. As described above, the discharge by the slide-contact portion is, for example, spark discharge, and such spark discharge is often continuously generated. Therefore, by providing the clear circuit 208 according to the present embodiment and dividing the continuous sparks one by one and performing determination, it is possible to detect the discharge with higher accuracy.

For this reason, the determination circuit 212 can more accurately detect the discharge based on at least one of the number of times of occurrence of the discharge and the discharge occurrence interval as well as the presence or absence of the occurrence of the discharge.

Fifth Embodiment

In each of the above-described embodiments, the configuration of the circuit in the discharge detection device 2 has been described. In the present embodiment, the overall coupling of this circuit will be described.

Figure 5:
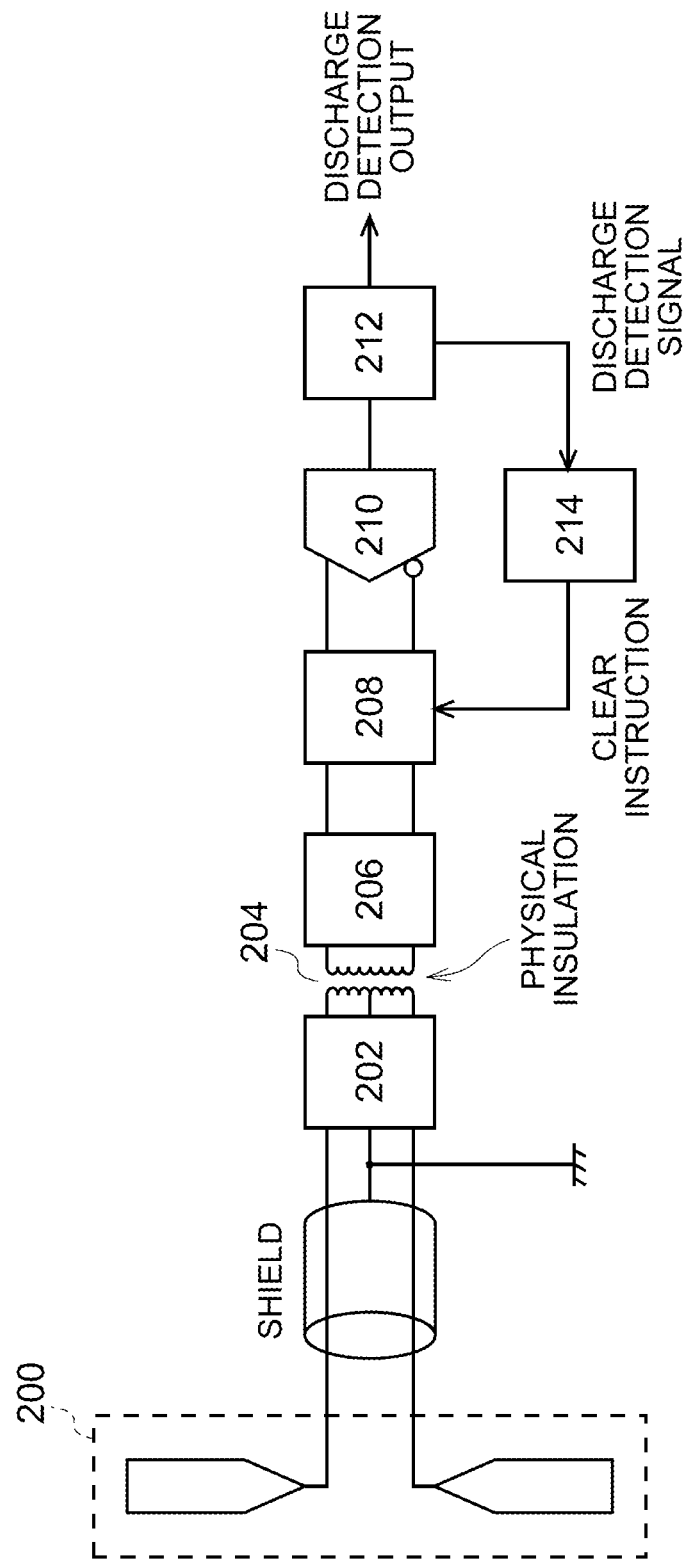
FIG. 5 is a diagram schematically illustrating an example of an overall path of a spark discharge detection device according to an embodiment.

FIG. 5 is a diagram schematically illustrating an overall path of the discharge detection device 2 according to the embodiment.

The discharge detection unit 200 may have a pair of balanced metal electrodes as metal electrodes. One balanced metal electrode is disposed at a position where it can appropriately capture discharge from the discharge from the slide-contact portion. In this case, when the discharge is captured in one electrode or both electrodes, the discharge detection unit 200 propagates the captured signal through a balanced line as a path.

In a case where the path is the balanced line, the balanced line may include a shield such that a noise signal from a portion other than the slide-contact portion is not superimposed (or overlapped) on the propagation signal, for example, at a subsequent stage of the discharge detection unit 200. For example, when the shield is used in the generator 1 of FIG. 1, the shield may be appropriately provided inside the generator 1. Of course, it is not excluded that the shield is provided even in a part of the inside of the discharge detection device 2 from the outside of the generator 1.

The signal propagated by the balanced line is input to the filter circuit 202. At this timing, the signal may be processed as a signal having positive and negative signals around the ground voltage.

The rectifier circuit 204 having a physically insulating region extracts absolute values of positive and negative signal values, for example, by coupling an electromagnetic transformer as illustrated in the drawing. Since the operation of the rectifier circuit 204 is similar to that of a general rectifier circuit, a detailed description thereof will be omitted.

This signal is input to the waveform extension circuit 206. The waveform extension circuit 206 extends a waveform represented as a signal of an absolute value in a time axis direction and outputs the waveform.

Thereafter, the determination circuit 212 determines the signal converted into the voltage via the voltmeter 210, thereby executing the discharge detection output. The determination circuit 212 notifies an appropriate external device or the like of the discharge detection result as necessary.

In addition, if necessary, the extended waveform is cleared by the clear time setting circuit 214 and the clear circuit 208, and the determination is executed.

In the embodiment, the path can thus be a balanced line.

Sixth Embodiment

Each of the above-described embodiments has a configuration in which each configuration is provided one by one, but the present invention is not limited thereto.

The discharge detection device 2 may include a plurality of the discharge detection units 200. The signals output from the plurality of discharge detection units 200 are coupled to the respective constituent circuits by appropriate lines. At least one of the plurality of discharge detection units 200 may have the balanced metal electrode described in the fifth embodiment, and in this case, the line coupled to the balanced metal electrode may be a balanced line.

By referring to the outputs from the plurality of discharge detection units 200, there is an effect that there is a deviation in the position of discharge, and discharge that cannot be detected by one discharge detection unit 200 can be covered by another discharge detection unit 200.

As another example, the discharge detection device 2 may branch the output of the discharge detection unit 200 into a plurality of branches, and compare the signal processing results in the respective branches to detect that discharge has occurred. For example, the filter circuit 202 to the determination circuit 212 may be provided for each branch. Parameters and the like of these circuits can be changed for each branch.

As described above, it is also possible to appropriately detect discharges in different situations by a plurality of lines. At least one determination circuit 212 of the plurality of determination circuits 212 provided for each branch may acquire an output from another determination circuit 212 and determine whether discharge is detected based on the determination results of the plurality of determination circuits 212. This determination may be a determination based on a rule, or may be a determination using a learned model that has been appropriately machine-learned.

Further, the plurality of discharge detection units 200 may be branched by a plurality of lines having different parameters.

The discharge detection method using the configuration described in each of the above embodiments is naturally included in the content of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A spark discharge detection device comprising:
a discharge detector detecting spark discharge between an electrode and a sliding body that is in contact with a sliding surface of the electrode;
a waveform extension circuit configured to extend a discharge waveform output from the discharge detector in a time direction and output the extended discharge waveform; and
a determination circuit configured to determine that discharge has occurred in the sliding body when a value of the extended discharge waveform exceeds a first threshold and a time during which the value exceeds the first threshold is held for a time longer than a first time for the output of the waveform extension circuit.

2. The spark discharge detection device according to claim 1, further comprising:
a voltmeter that is coupled to the waveform extension circuit and configured to measure a voltage of the output waveform, wherein
the determination circuit determines that discharge has occurred based on the voltage output from the voltmeter.

3. The spark discharge detection device according to claim 2, wherein
the waveform extension circuit is an integration circuit that has a predetermined voltage holding time constant, and
the voltmeter detects and holds the discharge waveform for a sampling time of ½ or less of the predetermined voltage holding time constant.

4. The spark discharge detection device according to claim 3, further comprising:
a clear circuit configured to return a voltage signal held at the predetermined voltage holding time constant to an initial value after a second time elapses after the voltage signal detected by the voltmeter exceeds the first threshold, between the waveform extension circuit and the voltmeter.

5. The spark discharge detection device according to claim 2, further comprising:
a filter that is coupled between the discharge detector and the waveform extension circuit and configured to selectively transmit a portion of a signal having a component larger than a second threshold with respect to a waveform of a discharge signal captured by the discharge detector, wherein
the waveform extension circuit processes an output of the discharge detector via the filter.

6. The spark discharge detection device according to claim 2, further comprising:
a filter circuit configured to limit a discharge signal captured by the discharge detector to an electric signal having a predetermined amplitude,
at a preceding stage of the waveform extension circuit or a preceding stage of the voltmeter.

7. The spark discharge detection device according to claim 2, further comprising:
a filter circuit that is coupled to the discharge detector and configured to selectively extract a signal of a predetermined frequency band with respect to a discharge signal captured by the discharge detector.

8. The spark discharge detection device according to claim 2, wherein
the discharge detector has a pair of balanced metal electrodes as the metal electrodes.

9. The spark discharge detection device according to claim 2, further comprising:
a plurality of the discharge detectors,
wherein the device, by comparing result of signal processing based on signals output from the plurality of discharge detectors, detects that discharge has occurred.

10. The spark discharge detection device according to claim 9, wherein
at least one of the plurality of discharge detectors has a pair of balanced metal electrodes, and balanced outputs from the discharge detectors having the pair of balanced metal electrodes to respective circuits by a balanced line.

11. The spark discharge detection device according to claim 2, wherein
the discharge detector divides an output of the discharge detector into a plurality of branches, and compares signal processing results in the respective branches to detect that discharge has occurred.

12. The spark discharge detection device according to claim 2, further comprising:
an insulating portion of which a coupling end is physically insulated from an internal electric circuit of the waveform extension circuit on an input side of the waveform extension circuit, and that transmits an electric signal.

13. A spark discharge detection method comprising:
detecting, by a discharge detector, spark discharge between an electrode and a sliding body that is in contact with a sliding surface of the electrode;
extending, by a waveform extension circuit, a discharge waveform output from the discharge detector in a time direction and output the extended discharge waveform; and
determining, by a determination circuit, that discharge has occurred in the sliding body when a value of the extended discharge waveform exceeds a first threshold and a time during which the value exceeds the first threshold is held for a time longer than a first time for an output of the waveform extension circuit.

* * * * *